United States Patent
Thomae et al.

(10) Patent No.: US 6,654,424 B1
(45) Date of Patent: Nov. 25, 2003

(54) METHOD AND DEVICE FOR TUNING A FIRST OSCILLATOR WITH A SECOND OSCILLATOR AND ROTATION RATE SENSOR

(75) Inventors: Andreas Thomae, Reutlingen (DE); Johannes Artzner, Reutlingen (DE); Reinhard Neul, Stuttgart (DE); Georg Bischopink, Pliezhausen (DE); Karsten Funk, Mountain View, CA (US); Markus Lutz, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/520,250

(22) Filed: Mar. 7, 2000

(30) Foreign Application Priority Data

Mar. 10, 1999 (DE) .......................... 199 10 415

(51) Int. Cl.[7] ............................. H04L 25/00; H03D 3/00
(52) U.S. Cl. ........................................ 375/257; 329/306
(58) Field of Search ............................. 375/257, 294, 375/323, 327, 354; 329/306, 308

(56) References Cited

U.S. PATENT DOCUMENTS

| | | | | |
|---|---|---|---|---|
| 4,027,265 A | * | 5/1977 | Kobayashi et al. ......... 329/308 |
| 4,868,514 A | * | 9/1989 | Azevedo et al. ............ 327/159 |
| 4,910,467 A | * | 3/1990 | Leitch ........................ 329/306 |
| 5,426,970 A | * | 6/1995 | Florida et al. ................ 73/1.37 |
| 5,889,193 A | * | 3/1999 | Pfaff et al. ..................... 73/1.37 |
| 5,930,697 A | * | 7/1999 | Bohme et al. .............. 455/315 |
| 6,157,037 A | * | 12/2000 | Danielson ................ 250/458.1 |

FOREIGN PATENT DOCUMENTS

DE 196 53 020 12/1996

* cited by examiner

Primary Examiner—Stephen Chin
Assistant Examiner—Lawrence Williams
(74) Attorney, Agent, or Firm—Michael J. Striker

(57) ABSTRACT

In the method and device for tuning a first oscillator with a second oscillator respective response signals of the first oscillator are produced from corresponding frequency-shifted and/or phase-shifted signals of the second oscillator. The first oscillator is tuned to the second oscillator according to the difference of the respective response signals. For amplitude correction a quotient is formed by dividing an output signal by the sum of the response signals. The method and device according to the invention are especially useful in a rotation rate sensor. The invention also includes a rotation rate sensor, which includes a device for determining rotation rate from the oscillations of a first and second oscillator and the device for tuning the first oscillator with the second oscillator.

18 Claims, 3 Drawing Sheets

METHOD AND DEVICE FOR TUNING A FIRST OSCILLATOR WITH A SECOND OSCILLATOR AND ROTATION RATE SENSOR

BACKGROUND OF THE INVENTION

1. Field of the Invention

The present invention relates to a method and device for tuning a first oscillator with a second oscillator and to a rotation rate sensor, which employs a method of this sort and/or a device of this type.

2. Prior Art

Different methods and devices are known, which handle detected signals numerically for evaluation of oscillatory signals of several oscillators, in order to consider amplitude errors, phase errors and the like. A signal analysis method, for example as described in DE-OS 196 53 020, is employed. Generally rotation rate sensors, which are used for Coriolis effect, are known in connection with systems for vehicle dynamic control in motor vehicles. The described rotation rate sensor comprises one or more masses, which are vibrationally excited by a voltage produced in an electrical circuit in the usual manner. The mechanical vibrations act on one or more acceleration sensors, which measure Coriolis acceleration acting on the vibrating masses. The rotation rates of the system can be determined from the excitation and acceleration signals with the help of a suitable analysis or evaluation circuit.

An additional electrical test signal, which is fed to the acceleration sensor or sensors, can also serve as an additional arbitrarily selected additional acceleration at the sensor. Thus, for example, information regarding the properties of the acceleration sensors and subsequently connected analysis circuit can be obtained. Thus it is also possible to detect errors, especially systematic errors. This is especially important since the rotation rate sensors evaluating the Coriolis effect have systematic errors, whose effect on the measured signal must be minimized by suitable selection of an analysis method. Oscillator frequencies that are as far apart as possible should be selected, so that the amplitude errors resulting from resonance rise and phase error are as small as possible, whereby electrical interference or crosstalk of the oscillator signal in the acceleration signal can be suppressed by phase-locked or -synchronized demodulation. Since the oscillator frequencies cannot be too far apart because of sensitivity losses, a certain residual error always remains present.

Analog and digital circuits are both used for signal processing for evaluation of the output signals of the rotation rate sensors. Those analysis circuits can determine the rotation rate and also still act to test the operation of the sensor or the evaluation circuit.

SUMMARY OF THE INVENTION

It is an object of the present invention to provide a method and device for analysis of vibrations or oscillations with a high precision and with small errors.

It is another object of the present invention to provide an improved rotation rate sensor of the above-described kind.

The method according to the invention for tuning a first oscillator to a second oscillator has the following steps:

a) generating two frequency-shifted and/or phase-shifted signals symmetric to an oscillation of the second oscillator;

b) exciting the first oscillator with the frequency-shifted and/or phase-shifted signals produced in step a);

c) determining a response behavior of the first oscillator to the frequency-shifted and/or phase-shifted signals produced in step a);

d) forming a difference signal from the respective response signals from the first oscillator, e.g. a phase difference signal or an amplitude difference signal; and e) tuning the frequency and/or the phase of the first oscillator according to the difference signal.

Two oscillations can thus be tuned to each other ("matched") by this method, so that, for example, a resonance rise is adjustable.

The first and second oscillators are preferably different, especially orthogonal modes of one and the same vibrating body. Thus, for example, a vibrating body with two degrees of freedom can be tuned or "matched" regarding its two oscillation modes. Alternatively, the method of course can be applied to two independent vibrating bodies and of course also with independent vibration directions.

The determination of the response behavior can occur in a particularly simple manner by means of detection of the amplitudes and/or phases of the oscillation of the first oscillator. These measured variables may be determined especially simply, e.g. by means of an acceleration sensor or the like means.

The tuning of the first oscillator occurs advantageously by shifting the eigenfrequency. An especially preferred method for shifting the eigenfrequency is the so-called electrostatic coupling, in which however other processes influence the vibration behavior, which are familiar to one skilled in the art. This latter method can be advantageously used to shift the eigenfrequency.

Finally, it is preferable that the method according to the invention is used as a regulating process, in which a repeated use of the process occurs to perform the control. Thus a permanent tuning ("matching") can be obtained, which compensates also for temperature changes and other parameters, since the oscillations can always be automatically tuned to each other.

The device for tuning the first oscillator with a second oscillator includes means for generating two frequency-shifted, and/or phase-shifted signals symmetric to the oscillation of the second oscillator; means for ascertaining the response behavior of the first oscillator to the frequency-shifted and/or phase-shifted signals and for producing a difference signal according to this response behavior and a control means for tuning the frequency and/or phase of the first oscillator according to the difference signal. The control means is preferably a regulating device, which guarantees a permanent tuning of the oscillations of the two oscillators.

Advantageously the apparatus according to the invention is employed with different, especially orthogonal, modes of one vibrating body and also with several independently vibrating bodies that oscillate in different directions.

In a further embodiment the control or regulating device comprises an electrostatic coupling device, in order to be able to tune the vibration behavior of the first oscillator in an especially simple manner, so that the "matching" of the two oscillations is possible by applying an electrical signal. Understandably also other devices influencing the oscillatory behavior are useable with the device according to the invention, like, e.g., the synchronization of additional springs and the like.

The rotation rate sensors according to the invention are characterized by operating by performing the method for tuning a first oscillator with a second oscillator according to the invention or they include a device for tuning a first oscillator with a second oscillator according to the invention.

It should also be noted that the invention is not limited to mechanical vibrations and oscillators.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 1:
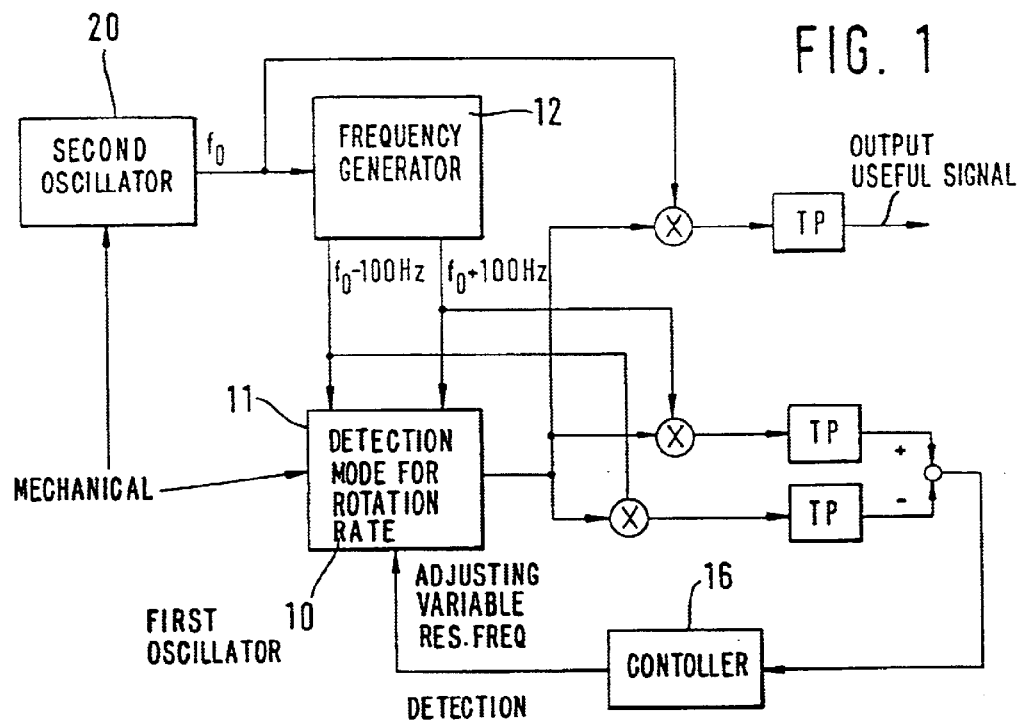
FIG. 1 is a block diagram of a first preferred embodiment of a rotation rate sensor according to the invention.

In the block diagram of FIG. 1 a second oscillator 20 is shown, which can generate an oscillator mode of an oscillating body or a single oscillating body. It is put into oscillation in the usual way as in the known rotation rate sensor. Its eigenfrequency, $f_o$, is input into a device 12, which is formed as a frequency generator in the embodiment shown and produces two test signals, whose respective frequencies are shifted symmetrically to the frequency of the second oscillator 20 by about ±100 Hz. A first oscillator 10 is put into oscillation or excited with these test signals. In the embodiment shown the first oscillator 10 is contained in a unit 11, which detects the response behavior or signals of the first oscillator to the signals produced by the frequency generator 12 and forms a difference signal from that response. This difference signal is fed into a controller 16 using a suitable analysis circuit, which causes a change in the oscillatory behavior of the first oscillator 10 by suitable means. As soon as the two oscillators 10,20 resonate, so that there is no difference signal, the output signal can be used under stable analysis conditions. Thus two oscillator modes of the rotation rate sensor can be automatically tuned to each other, which leads to stable evaluation or analysis conditions for the Coriolis force measurement. Since the detection mode or the first oscillator is operated exactly at its eigenfrequency, a sensitivity increase corresponding to the resonance rise, which means a good quality factor, can be obtained. Consequently the resolution may be considerably improved, since the oscillations are always matched or tuned to each other by the control circuitry. Also the temperature changes and aging effects can be automatically controlled.

Figure 2:
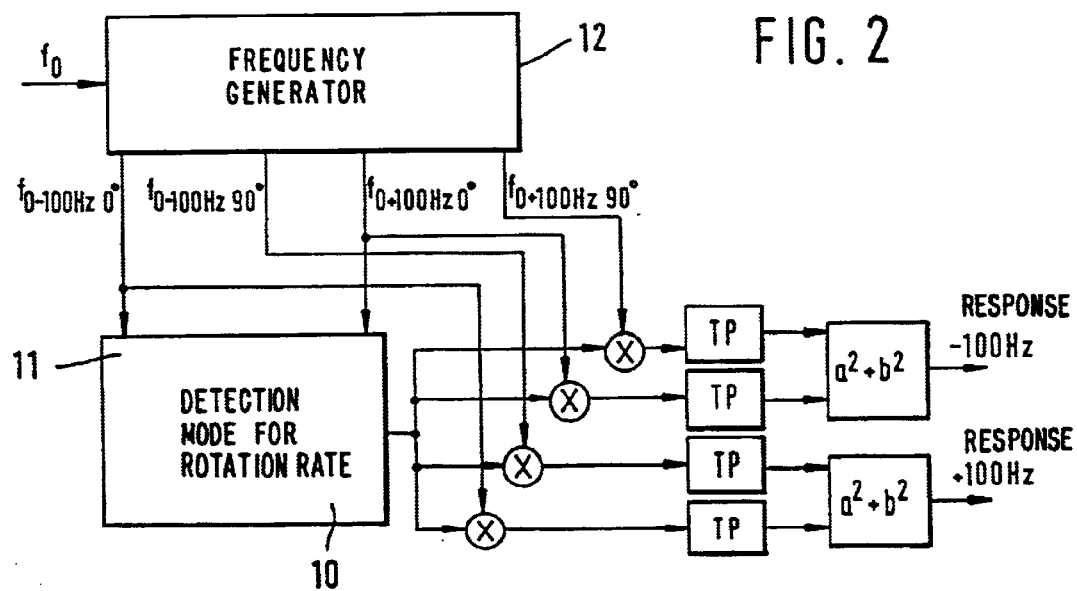
FIG. 2 is a block diagram of a part of a second preferred embodiment of a rotation rate sensor according to the invention.

In the embodiment shown in FIG. 2 an analysis of the amplitudes of the test signal response signals, which considers the phase errors, is also performed. As in the embodiment of FIG. 1 multiplication of the corresponding test signal response signals with the respective test signals is performed separately and the respective product signals are subtracted to form the difference signal. Additional multiplication of the corresponding test signal response with respective phase shifted test signals, which are phase shifted about 90° relative to the original test signals, is performed. The product signals resulting from the multiplication with the original test signals and the corresponding additional multiplication with the phase shifted test signals are geometrically added, in order to obtain information regarding the actual amplitude of the response to the test signals. The features of the embodiment shown in FIG. 2 are of course combined with those of the embodiment shown in FIG. 1.

Alternatively the resonance frequency of the detector circuit or the first oscillator can be controlled with the aid of an analysis of the phase difference between the test signal response and the second oscillator. The phase shift of the second oscillator amounts to exactly 90° at its resonance point. The detection mode for the rotation rate thus determines a difference signal from the test signal response, and at the same time from the phase shifted test signal response, and in a similar manner tunes the first oscillator 10. Thus the first oscillator 10 is tuned until a resonance condition occurs, in which the magnitudes of the differences of the phase shifted signals are identical, i.e. until the difference signal fed to controller 16 is zero or no longer occurs.

Figure 3:
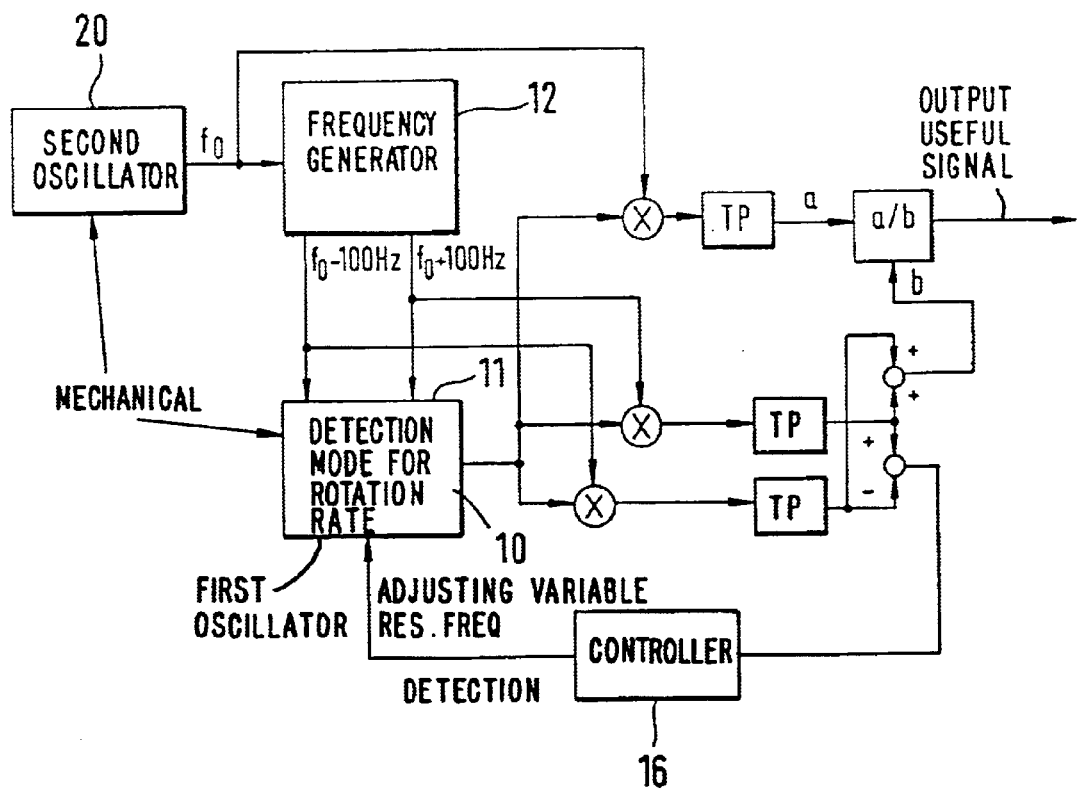
FIG. 3 is a block diagram of another preferred embodiment of a rotation rate sensor according to the invention, with sensitivity correction means.

FIG. 3 shows another preferred embodiment, with which a sensitivity correction can be performed. In this embodiment information regarding the resonance rise is obtained from the sum of twin test signal responses. A quotient is formed by dividing the useful output signal by the sum signal, whereby the sensitivity of the useful output signal can be normalized, i.e. independently of the quality factor for the detection circuit.

Figure 4:
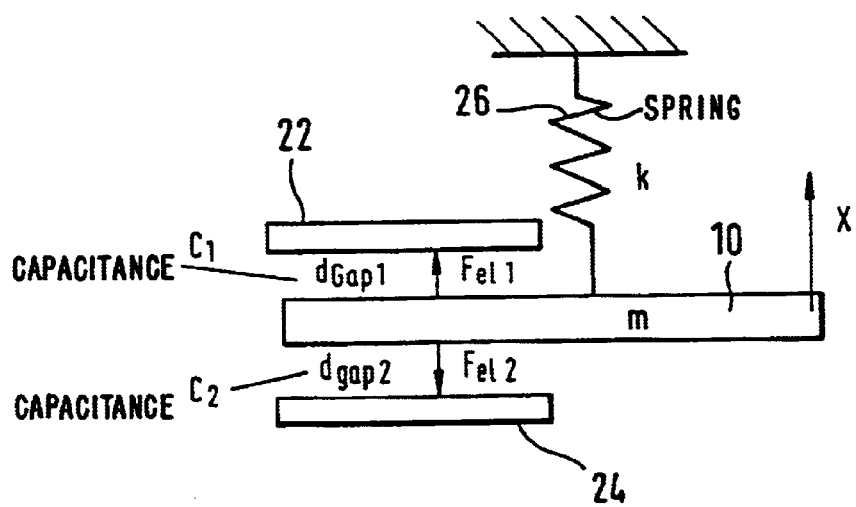
FIG. 4 is a diagrammatic view showing the influence of the oscillatory behavior of an oscillator as a part of a preferred embodiment of the device according to the invention or the rotation rate sensor according to the invention.

FIG. 4 shows schematically the operational principle of the electrostatic positive coupling that can be employed as a device for tuning the first oscillator, especially when it is a mechanical oscillator. The oscillator frequency of the oscillator can generally be reduced by the so-called electrostatic positive coupling. An electrostatic positive coupling results, when a direct current voltage is applied to a device for measuring a capacitance difference (which is also true for a simple capacitor). The arrangement measuring capacitance difference is formed by a plate capacitor with plates 22, 24 and an oscillating or vibrating body 10 placed between the plates 22, 24. The capacitance that arises between the oscillating body 10 and the individual plates of the plate capacitor 22,24 is determined by these measurements. The oscillating body 10 is suspended on a spring 26 in the illustrated embodiment, which has a spring constant k. The stiffness of the system is due to the sum of the mechanical and electrostatic stiffness. The electrostatic stiffness corresponds to the derivative of the electrostatic force, $F_{el}$, with respect to the displacement of the oscillating body 10. The system can be made harder or softer by means of the electrostatic positive coupling, since a potential difference exists across the two plates. The positive coupling factor $k_m$ can be theoretically calculated using the following equation (1):

$$k_m = \frac{dF_{el}}{dx} = \frac{d}{dx}\left[\frac{1}{2}\varepsilon \frac{A}{(d_{Gap} - x)^2} U^2\right] \quad (1)$$

wherein A is the area of the plate capacitor, x is the displacement of the oscillating body from its equilibrium position, U is the potential or voltage and $d_{Gap}$ is the spacing between the plates of the capacitor. The above equation (1) leads to the following equation (2) for the resonance frequency of the first oscillator of the detection mode as follows:

$$f = \frac{1}{2*\pi}\sqrt{\frac{k-k_m}{m}} \qquad (2)$$

wherein k is the spring constant for the oscillating body 10 and m is its mass.

Alternatively to the electrostatic positive coupling the first oscillator can be tuned by the so-called closed-loop operation, which is not described in further detail here, since that method is well known to one skilled in the art regarding oscillating bodies.

Figure 5:
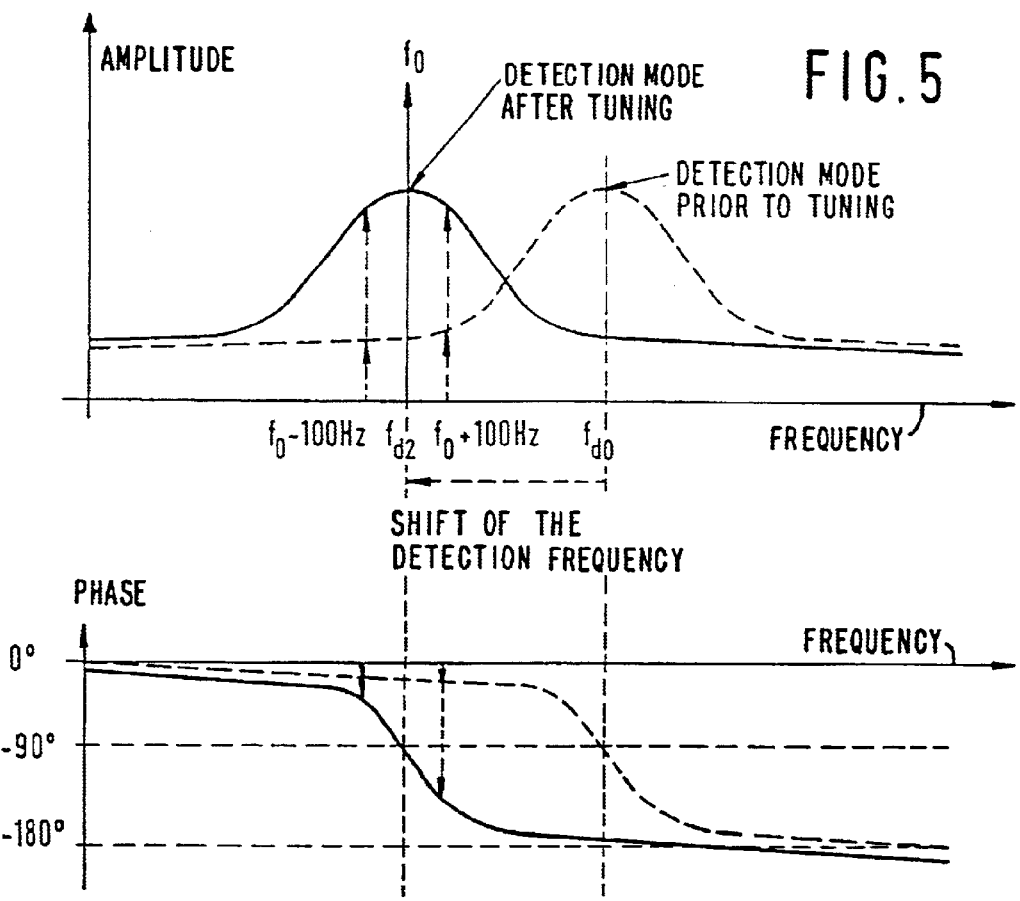
FIG. 5 is a Bode's diagram for illustration of the method according to the invention or the device according to the invention.

The device and method according to the invention, and also the rotation rate sensor using the method and device according to the invention, are better understood with the aid of the following description of Bode's diagram illustrated in FIG. 5. In the upper portion of FIG. 5 the oscillatory behavior of the first oscillator is illustrated. The dependence of the amplitude of the response on the frequency of the test signal is shown in the upper portion of FIG. 5. The resonance distribution of the first oscillator, which is present prior to performing the method according to the invention, is illustrated with the dashed line. If the first oscillator is excited with the test frequencies, i.e. with the frequencies around $f_o$, two different sized amplitudes for the responding signals result. Then a difference is formed between these two responding signals and causes a shift in the detection frequency depending on this difference signal, so that a resonance frequency curve is obtained, which is illustrated with a solid line. Thus the first oscillator is tuned in such manner that its resonance frequency corresponds to the frequency $f_o$. In this condition or state the amplitudes of the response signals at both test frequency correspond to each other, so that no difference signal results when they are subtracted from each other. This produces a resonance condition, in which the two oscillators are in resonance with each other. In contrast to the state of the art it is no longer necessary to separate the oscillator mode as far as possible from the oscillator frequency, as is currently the situation with the data rate sensor of the prior art. Furthermore amplitude errors due to resonance rise and phase errors no longer occur, since a stable resonance condition is always maintained by the permanent control.

In a similar manner to the evaluation with the aid of the amplitude the method and device according to the invention can also be based on analysis of a phase of a first oscillator, as is shown in the lower portion of FIG. 5.

Figure 6:
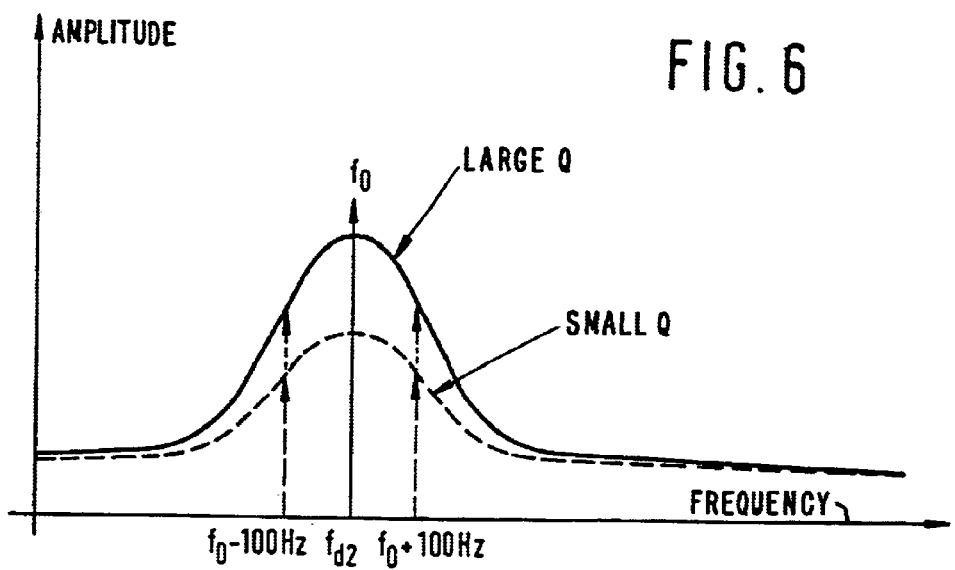
FIG. 6 is an additional Bode's diagram for illustration of the method of the invention.

Bode's diagram illustrating the sensitivity correction is provided in FIG. 6. As was mentioned in connection with the preferred embodiment of FIG. 2, information can be obtained regarding the resonance rise by summing both test signal response signals. If a quotient is formed by dividing the useful output signal by the sum signal, the sensitivity of the useful output signal is determined independently of the quality factor for the detection circuit, so that solid curve in the amplitude frequency diagram results, which has fewer errors.

In summary it can be said that the resonance rise can be used in the solution according to the invention, in contrast to the state of the prior art, where the two frequencies must be separated as much as possible to avoid amplitude and phase errors. The sensitivity error can be completely compensated by operation in the resonance rise, so that a rotation rate sensor can be provided, which has an improved response and a simpler evaluation of the useful signal. It should also be mentioned that the invention may be embodied in an analog as well as a digital signal processor.

The disclosure in German Patent Application 199 10 415.8 of Mar. 10, 1999 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method and device for tuning a first oscillator with a second oscillator and rotation rate sensor based on same, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of tuning a first oscillator to a second oscillator, said method comprising the steps of:
    a) generating two frequency-shifted and/or phase-shifted signals symmetric to an oscillation of the second oscillator;
    b) exciting the first oscillator with the frequency-shifted and/or phase-shifted signals produced in step a);
    c) determining a response behavior of the first oscillator to the frequency-shifted and/or phase-shifted signals produced in step a);
    d) forming a difference signal from respective response signals to the corresponding frequency-shifted and/or phase-shifted signals produced in step a); and
    e) tuning a frequency and/or a phase of an oscillation of the first oscillator according to the difference signal.

2. The method as defined in claim 1, wherein the difference signal is a phase difference signal or an amplitude difference signal.

3. The method as defined in claim 1, wherein said first oscillator (10) and said second oscillator (20) are different modes of a single oscillating body.

4. The method as defined in claim 3, wherein said different modes are orthogonal.

5. The method as defined in claim 1, wherein said first oscillator (10) and said second oscillator (20) are independent oscillating bodies.

6. The method as defined in claim 1, wherein the determining of the response behavior of the first oscillator includes determining an amplitude and/or said phase of the oscillation of the first oscillator (10).

7. The method as defined in claim 1, further comprising forming a quotient by dividing a useful output signal by a sum of said response signals from the first oscillator, and wherein said response signals are characterized by an amplitude and/or said phase of the first oscillator.

8. The method as defined in claim 1, wherein the tuning of the frequency and/or the phase of the oscillation of the first oscillator includes shifting of an eigenfrequency of the oscillation of the first oscillator.

9. The method as defined in claim 8, wherein said shifting of said eigenfrequency occurs by means of electrostatic positive coupling.

10. The method as defined in claim 1, further comprising continuously repeating said steps of the method.

11. A device for tuning a first oscillator with a second oscillator, said device comprising means (12) for generating two frequency-shifted and/or phase-shifted signals symmetric to an oscillation of the second oscillator;

means (11) for determining a response behavior of the first oscillator to the frequency-shifted and/or phase-shifted signals;

means for forming a difference signal from respective response signals of the first oscillator to the corresponding frequency-shifted and/or phase-shifted signals; and control means (16) for tuning a frequency and/or a phase of an oscillation of the first oscillator according to the difference signal.

12. The device as defined in claim 11, wherein said first oscillator (10) and said second oscillator (20) are different modes of a single oscillating body.

13. The device as defined in claim 12, wherein said different modes are orthogonal.

14. The device as defined in claim 11, wherein said first oscillator (10) and said second oscillator (20) are independent oscillating bodies.

15. The method as defined in claim 11, wherein said control means (16) includes means for electrostatic positive coupling.

16. The method as defined in claim 11, further comprising means for forming a quotient by dividing a useful output signal by a sum of said response signals from the first oscillator, and wherein said response signals are characterized by an amplitude and/or said phase of the oscillation of the first oscillator.

17. A rotation rate sensor including a signal processing device, said signal processing device including means for determining a rotation rate from oscillations of a first oscillator and of a second oscillator and means for tuning the first oscillator with the second oscillator, said means for tuning the first oscillator to the second oscillator comprising means (12) for generating two frequency-shifted and/or phase-shifted signals symmetric to the oscillation of the second oscillator;

means (11) for determining a response behavior of the first oscillator to the frequency-shifted and/or phase-shifted signals;

means for forming a difference signal from respective response signals of the first oscillator to the corresponding frequency-shifted and/or phase-shifted signals; and control means (16) for tuning a frequency and/or a phase of the oscillation of the first oscillator according to the difference signal.

18. A rotation rate sensor including a signal processing device, said signal processing device including means for determining a rotation rate from oscillations of a first oscillator and of a second oscillator and performing a method for tuning the first oscillator with the second oscillator, said method for tuning the first oscillator to the second oscillator comprising the steps of:

a) generating two frequency-shifted and/or phase-shifted signals symmetric to the oscillation of the second oscillator;

b) exciting the first oscillator with the frequency-shifted and/or phase-shifted signals produced in step a);

c) determining a response behavior of the first oscillator to the frequency-shifted and/or phase-shifted signals produced in step a);

d) forming a difference signal from respective response signals to the corresponding frequency-shifted and/or phase-shifted signals produced in step a); and e) tuning a frequency and/or a phase of the oscillation of the first oscillator according to the difference signal.

* * * * *